US009585277B2

(12) United States Patent
Giraldo et al.

(10) Patent No.: US 9,585,277 B2
(45) Date of Patent: Feb. 28, 2017

(54) THROUGH CONNECTION OF A DISPLAY DEVICE

(71) Applicant: Liquavista B.V., Eindhoven (NL)

(72) Inventors: Andrea Giraldo, Riehen (CH); Paul Vermeulen, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 235 days.

(21) Appl. No.: 14/205,709

(22) Filed: Mar. 12, 2014

(65) Prior Publication Data

US 2014/0192465 A1   Jul. 10, 2014

Related U.S. Application Data

(63) Continuation of application No. PCT/EP2012/068175, filed on Sep. 14, 2012.

(30) Foreign Application Priority Data

Sep. 16, 2011   (GB) .................................. 1116093.4

(51) Int. Cl.
*G02B 26/00* (2006.01)
*H05K 7/02* (2006.01)
*H05K 13/00* (2006.01)

(52) U.S. Cl.
CPC ............. *H05K 7/02* (2013.01); *G02B 26/005* (2013.01); *H05K 13/00* (2013.01); *Y10T 29/49117* (2015.01)

(58) Field of Classification Search
CPC .... G02B 26/00; G02B 26/004; G02B 26/005; G02B 26/002; G02B 26/007; G02B 26/02; G02B 26/08

USPC .............................. 359/227–229, 237, 226.3
See application file for complete search history.

(56) References Cited

U.S. PATENT DOCUMENTS

| | | | | |
|---|---|---|---|---|
| 7,852,547 B2 * | 12/2010 | Kim | ..................... | G02B 26/005 345/107 |
| 2006/0285067 A1 | 12/2006 | Kim | | |
| 2010/0033451 A1 | 2/2010 | Shinn et al. | | |
| 2010/0053514 A1 | 3/2010 | Chuang | | |
| 2010/0157410 A1 | 6/2010 | Kim et al. | | |

FOREIGN PATENT DOCUMENTS

| | | |
|---|---|---|
| CN | 1881003 A | 12/2006 |
| CN | 101517624 A | 8/2009 |
| CN | 101593756 A | 12/2009 |
| CN | 101650894 A | 2/2010 |
| WO | 03/071346 A1 | 8/2003 |
| WO | 2004/104671 A1 | 12/2004 |
| WO | 2005/098797 A2 | 10/2005 |
| WO | 2008/026179 A2 | 3/2008 |
| WO | 2009/065909 A1 | 5/2009 |
| WO | 2009/071694 A2 | 6/2009 |
| WO | 2009/124935 A1 | 10/2009 |

* cited by examiner

*Primary Examiner* — Ricky Mack
*Assistant Examiner* — Robert E Tallman
(74) *Attorney, Agent, or Firm* — EIP US LLP

(57) ABSTRACT

An electrowetting display device comprising at least one picture element with a first support plate including a first electrical element, a second electrical element and a through-connection electrically connecting the first electrical element to the second electrical element. The through-connection is arranged outside a projected display area of the at least one picture element.

22 Claims, 3 Drawing Sheets

THROUGH CONNECTION OF A DISPLAY DEVICE

CROSS REFERENCE TO RELATED APPLICATIONS

This application is a continuation under 35 U.S.C. §120 of PCT Application No. PCT/EP2012/068175 filed Sep. 14, 2012.

BACKGROUND

An electrowetting display is known which comprises a plurality of picture elements having a first support plate, a second support plate and a space between the first support plate and the second support plate, the space including at least one first fluid and a second fluid immiscible with each other. Each of the plurality of picture elements includes an electrode for applying an electric field in the element. The electrode may be connected to underlying picture element circuitry by a through-connection, also known as a via, formed in the first support plate. A display effect may be created in a display area of each picture element by applying the electric field.

It is desirable to provide an improved display device.

DETAILED DESCRIPTION

Figure 1:
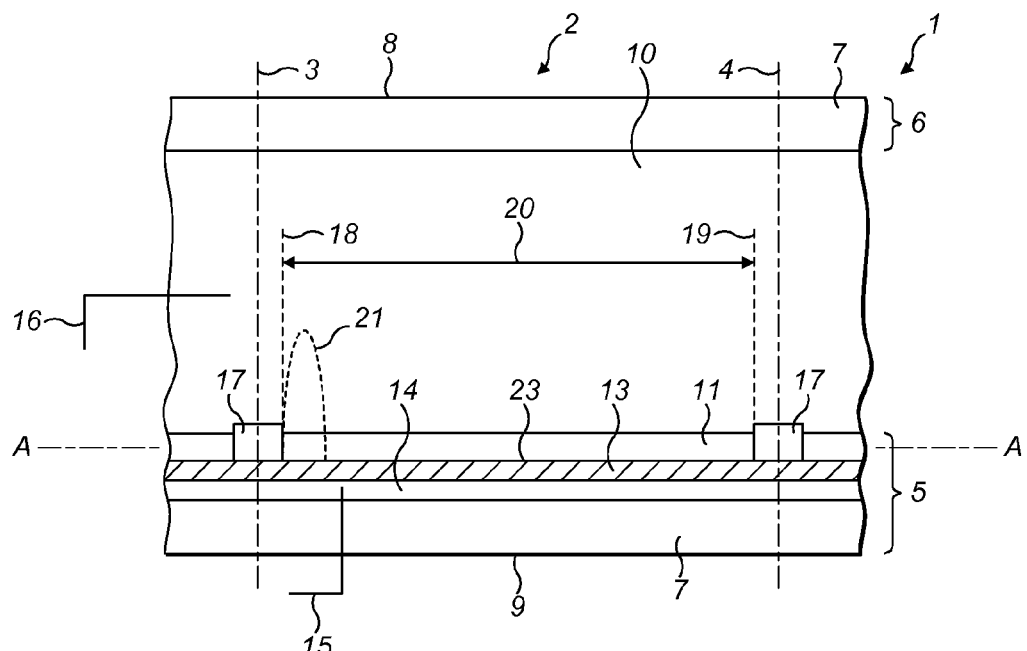
FIG. 1 shows a diagrammatic cross-section of part of an electrowetting display device.

The entire contents of the following patent documents are incorporated by reference herein:
1. GB 1116093.4 filed on 16 Sep. 2011
2. PCT/EP2012/068175 filed Sep. 14, 2012

Embodiments described herein relate to improvements in relation to a method of manufacturing an electrowetting device.

Before describing detailed embodiments referencing the Figures, embodiments will be described in summary form.

In accordance with first embodiments, there is provided an electrowetting display device comprising at least one picture element, a first support plate, a second support plate and a space between the first support plate and the second support plate, the space including a first fluid and a second fluid immiscible with each other, the first support plate including a first electrical element, a second electrical element and a through-connection electrically connecting the first electrical element to the second electrical element, the at least one picture element comprising at least part of the second electrical element and a display area, wherein the through-connection is arranged such that, when the display area is projected through the first support plate, the through-connection is outside the projected display area.

A new problem has been identified which is unknown.

A through-connection formed in a first support plate of an electrowetting picture element is known. In order to control motion of a first and second fluid, a through-connection is used for creating a height difference in a surface of the first support plate such that the first fluid forms a non-uniform thickness layer on the first support plate when no voltage is applied between an electrode and the second fluid. Thus, the height difference causes differences in the strength of electric field applied across the layer of the first fluid when a voltage is applied between an electrode and the second liquid. The applied field is greater where the thickness of the first fluid is less. Therefore, at the position of the through-connection, which forms a depression in the surface of the first support plate, the first fluid is thicker and thus the applied electric field is less. This creates a location where the first fluid preferentially moves towards, thereby forming a pinning location for the first fluid.

It has been identified that in known systems the through-connection causes undesirable motion of the first and second liquids. At the surface of the first support plate, an edge of the depression formed by the through-connection experiences a fringe field upon application of the voltage. This causes, undesirably, initiation of fluid motion at the edge, resulting in uncontrolled motion of the first fluid and agglomeration of the first fluid at several locations in the picture element rather than at one preferred location. This impairs the quality of the display effect in the picture element and therefore in an electrowetting display; this is manifested in a still or moving image as low brightness of the image, retention of the previous image or non-uniform switching behavior across the display.

Moreover, it is known that the presence of the through-connection and electrical elements in the first support plate cause insulating layers and a hydrophobic layer formed over the through-connection and electrical elements, to have a non-uniform thickness. This is due to limitations in the manufacture, meaning the insulating layers and a hydrophobic layer may be thinner at the edge of the depression formed by the through-connection than elsewhere without an underlying through-connection. This may lead to delamination or breakdown of the insulating layers, or may accelerate electrolysis between the fluids and the insulating layers at the edge, thereby reducing the lifetime of the display. Further, thinner insulating layers and/or a hydrophobic layer at the edge results in a higher electric field being applied at the edge compared with another part of the surface without the through-connection underneath, and therefore initiation of fluid motion at the edge.

It has now been realized that the through-connection does not need to be arranged in a part of the picture element which is defined by projecting the display area through the first support plate. Therefore, in embodiments to be described, the through-connection is arranged outside of a projected display area of the picture element.

The term display area used herein is an area, when viewed from a viewing side of the picture element, within which the first fluid is confined and over which a display effect is provided. Further details of the display area will be explained below.

The term through-connection, also referred to as a via, used herein is defined as an electrical connection between the first electrical element which for example is part of a transistor for an active matrix display device, and the second electrical element such as an electrode for applying an electric field in the picture element. To apply a voltage to the second electrical element, a voltage signal applied to the first electrical element is conducted to the second electrical element via the through-connection, i.e. through the through-connection.

The term projecting is used herein in the context of a display area and a border area of a picture element, to describe clearly the arrangement of the through-connection with respect to the display area and the border area. In embodiments described below, a display area and a border area are two dimensional and planar. Projecting the display area through the first support plate means projecting the extent of the display area through the first support plate in a direction perpendicular the plane of the display area, for example towards a rear side of the picture element, thus defining a part of the picture element with the extent of the display area. The term projected display area may be used below to refer to such a part. Similarly, projecting the border area through the first support plate means projecting the extent of the border area through the first support plate in a direction perpendicular the plane of the border area, and for example towards a rear side of the picture element, thus defining a part of the picture element with the extent of the border area. The term projected border area may be used below to refer to such a part.

Embodiments described herein overcome the problems described. With the through-connection being arranged outside the projected display area of the picture element, the optical performance of the picture element such as brightness may be significantly enhanced because motion of the first fluid is now more controllable over the display area, compared with known systems, since as an example the thickness of insulating layers and a hydrophobic layer, beneath the display area may now be uniform. With the through-connection arranged outside the projected display area, a surface of the first support plate may be free of height differences and therefore a fringe field associated with an edge of the through-connection may no longer exist. Further, as an example, insulating layers and a hydrophobic layer may now have a uniform thickness within the projected display area and the lifetime of the display may therefore also be improved.

Further, manufacturing the picture element and display device of embodiments described herein is simple, without requiring complex modifications to current manufacturing methods for an electrowetting display device.

Arranging the through-connection outside of the projected display area as in embodiments described herein is contrary to the teaching of known systems to position the through-connection underneath a display area.

In some embodiments, the at least one picture element may include a first and a second picture element, wherein when the display area of the first and second picture elements is projected through the first support plate the through-connection is arranged between the projected display area of the first picture element and the projected display area of the second picture element. One or more through-connections may therefore be arranged in a display device between the projected display area of the first picture element and the projected display area of the second picture element. An area between the display areas of adjacent picture elements may not be used for creating a display effect; therefore, by locating the through-connection between and outside of the projected display areas, there may be no detrimental impact on the display effect created in the display area. In some embodiments where the picture element has more than one second electrical element for creating the display effect, more than one through-connection may be arranged outside the projected display area, between the projected display areas of the first and second picture elements, for example.

The first and second picture elements may be neighboring picture elements. The through-connection may therefore be arranged between the projected display areas of two picture elements that are next, i.e. adjacent, to each other. One through-connection may be associated with the first picture element and a further through-connection may be associated with the second picture element. In some embodiments, both of these through-connections may be arranged between the projected display areas of the first and second picture elements.

Figure 5:
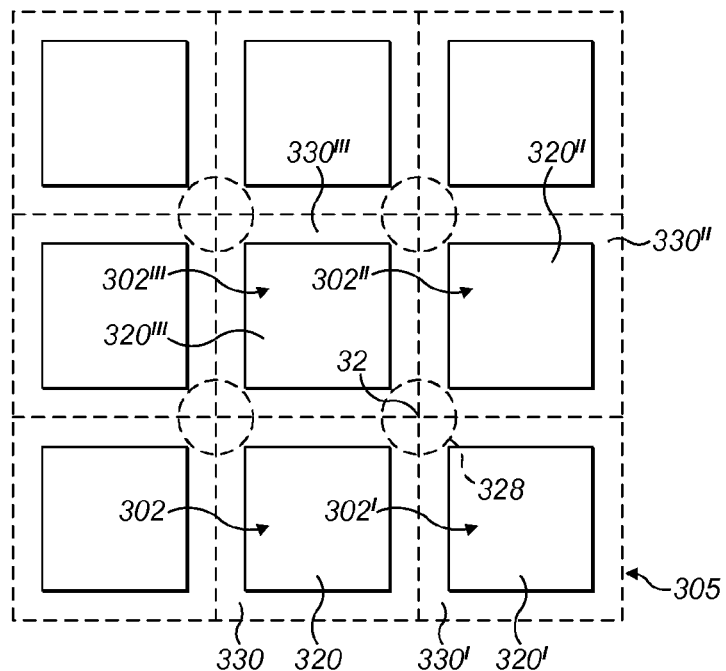
FIG. 5 shows schematically an alternative embodiment.

In a further embodiment, the at least one picture element may include a third and a fourth picture element, wherein when the display area of the third and fourth picture elements is projected through the first support plate the through-connection is arranged between the projected display areas of the first, second, third and fourth picture elements. Therefore, the through-connection may be arranged at a junction between four picture elements. This junction may give a larger space for locating the through-connection since, when viewed from a viewing side of the picture element, and when compared with locating the through-connection between the projected display areas of two adjacent picture elements, the through-connection is not constrained between the sides of the display areas of the two picture elements. Instead, in this embodiment, the through-connection is less constrained by four picture element corners, one for each of the four picture elements; where the dimensions of the through-connection are fixed, being determined by the manufacturing technology, arranging the through-connection between the projected display areas of the first, second, third and fourth picture elements gives greater freedom of design for arranging the through-connection outside of the projected display area, without affecting the display effect of the display area. This is illustrated in FIG. 5.

In further embodiments, the at least one picture element may comprise a border area outside of the display area, wherein when the border area is projected through the first support plate at least part of the through-connection is arranged in the projected border area. In such embodiments, the at least one picture element comprises a display area and a border area outside the display area, which border area may be adjacent a side of the display area. The border area may surround the display area of a picture element. In a display device comprising a matrix of picture elements, each picture element may lie adjacent another picture element, with an outer side of each of their border areas adjoining each other. At least part of the through-connection may be arranged in the projected border area of the picture element; for example, part of the through-connection may be arranged in a projected border area of a first picture element, and the other part of the through-connection may be arranged in a projected border area of a second picture element. In embodiments comprising also a third and fourth picture element, each of the first, second, third and fourth picture elements may comprise a border area, outside of the projected display areas. Therefore, when the border area of the third and fourth picture elements is projected through the first support plate at least part of the through-connection may be arranged in the projected border areas of the third and fourth picture elements, as well as in those of the first and second picture elements. Alternatively, the whole of the through-connection may be arranged in the projected border area of one picture element, for example in a display device having only one picture element. There are many alternatives envisaged for arranging the through-connection outside the projected display area. This gives increased design freedom for arranging a through-connection in the picture element.

In a further embodiment, the border area of the at least one picture element comprises at least part of a wall arranged to confine the first fluid to the display area. The wall may be in the form of a wall structure or a wettability treatment, formed of a wall material, and may surround the display area of the at least one picture element. In some embodiments, the wall may separate the display areas of adjacent picture elements. Thus, at least part, for example half, of the wall may lie in the border area of one picture element and at least part, for example half, of the wall may lie in the border area of an adjacent picture element. Alternatively, the whole of the wall may be arranged in the border area of one picture element. The wall material may be selected so as not to contribute to or interfere with the display effect.

In further embodiments, at least part of the wall is arranged to partially or fully cover the through-connection. The through-connection may therefore be arranged at least partly under a wall of the picture element. In some embodiments, a wall may be formed by filling a depression caused by an underlying through-connection with wall material. This can reduce or eliminate undesirable surface topography in close proximity to the display area, compared with other configurations of forming a wall on a surface of the first support plate. Therefore, surface irregularities which may affect fluid motion can be avoided, and the controllability of the fluid motion in the display area may be improved.

In yet further embodiments, the second electrical element is an electrode for applying an electric field in the at least one picture element and the first electrical element is arranged to provide a voltage signal to the electrode, via the through-connection. The first electrical element may be part of, or may be connected to, any of a transistor, a capacitor or an electrically conducting layer or line, such as a control line. Such electronic components are commonly used in active matrix displays, and can aid display performance owing to their compact size.

In further embodiments, the through-connection is arranged such that when a voltage is applied to the second electrical element a fringe field is outside the display area. Thus, when a voltage is applied to the second electrical element, a configuration of the first and second fluids may not be undesirably affected by any fringe field from the through-connection.

In a further embodiment, the through-connection is arranged through at least one layer of the first support plate the at least one layer separating the first electrical element and the second electrical element. The through-connection may therefore enable connection of the first and second electrical elements through other functional layers of the first support plate.

In accordance with further embodiments, there is provided a first support plate for an electrowetting display device comprising at least one picture element having a display area, the first support plate comprising a first electrical element, a second electrical element and a through-connection electrically connecting the first electrical element to the second electrical element, wherein the through-connection is arranged such that when the first support plate is assembled in the electrowetting display device and the display area is projected through the first support plate the through-connection is outside the projected display area. The first support plate may for example be provided pre-assembled or partly assembled for a manufacturing process of the display device of embodiments. Therefore, the first support plate may be provided, for example, with all components composing the circuitry of an active matrix and the arrangement of through-connections for a matrix of picture elements, each through-connection connecting the corresponding first and second electrical element and each through-connection arranged to be outside of the projected display area of the picture element when in the assembled display device. With the provision of such a support plate, subsequent stages of assembling a complete electrowetting display device, i.e. step-wise processing of the support plate, may be simplified. Such steps may include for example forming walls at predetermined locations, applying the first and second fluids, providing the second support plate and sealing the first and second support plates together.

In certain embodiments, wall material at least partly covers the through-connection. The first support plate may therefore be arranged to confine the first fluid within the display area of the picture element of a display device, when fully assembled. In examples, where the wall material partly or completely covers the through-connection, unwanted surface topography near or in the display area may be reduced or eliminated, thus effecting controllable fluid motion and improving optical performance of the display device.

Embodiments will now be described in detail.

FIG. 1 shows a diagrammatic cross-section of part of an electrowetting display device 1. The display device includes at least one picture element 2, also known as a pixel, one of which is shown in the Figure. The lateral extent of the picture element is indicated in the Figure by two dashed lines 3, 4. The electrowetting display device comprises a first support plate 5 and a second support plate 6. The support plates may be separate parts of each picture element, and the support plates may be shared in common by the plurality of picture elements. The support plates may include a glass or polymer substrate 7 and may be rigid or flexible. The display device has a viewing side 8 on which an image or display formed by the display device can be viewed and a rear side 9. In the Figure the first support plate 5 faces the rear side; the second support plate 6 faces the viewing side; alternatively, the first support plate may face the viewing side.

The display device may be of the reflective, transmissive or transflective type. The display device may be of a segmented display type in which the image may be built up of segments, each segment may include one or more picture elements. The display device may be an active matrix driven display type or a passively driven display device. The plurality of picture elements may be monochrome. Alternatively, for a full color display device, the picture elements may be sub-pixels, each sub-pixel having a different color; alternatively, an individual picture element may be able to show different colors.

A space 10 between the support plates is filled with two fluids: a first fluid 11 and a second fluid 12, wherein the fluids may, for example, be liquids. The second fluid is immiscible with the first fluid. The second fluid is electrically conductive or polar, and may be, for example, water or a salt solution such as a solution of potassium chloride in a mixture of water and ethyl alcohol. The second fluid may be transparent, but may be colored, white, absorbing or reflecting. The first fluid is electrically non-conductive and may for instance be an alkane like hexadecane or (silicone) oil. The first fluid absorbs at least a part of the optical spectrum. The first fluid may be transmissive for a part of the optical spectrum, forming a color filter. For this purpose the first fluid may be colored by addition of pigment particles or dye.

Alternatively, the first fluid may be black, i.e. absorb substantially all parts of the optical spectrum, or reflecting. A reflective layer may reflect the entire visible spectrum, making the layer appear white, or part of it, making it have a color.

A hydrophobic layer 13 is arranged on the support plate 5, the former may be transparent or reflective. The hydrophobic layer may be an uninterrupted layer extending over a plurality of picture elements 2 or it may be an interrupted layer, each part extending only over a plurality of picture elements 2, as shown in the Figure. The layer may be for instance an amorphous fluoropolymer layer such as AF1600 or another low surface energy polymer. The hydrophobic character causes the first fluid to adhere preferentially to the first support plate 5, since the first fluid has a higher wettability with respect to the surface of the hydrophobic layer 13 than the second fluid. Wettability relates to the relative affinity of a fluid for the surface of a solid.

The first support plate includes a first electrical element and a second electrical element. The second electrical element is for example an electrode 14 arranged in the support plate 5. The electrode 14 is separated from the fluids by an electrically insulating cover layer, which may be the hydrophobic layer 13. Further layers may be arranged between the hydrophobic layer and the electrode. The electrode 14 can be of any desired shape or form and in this example is planar. The electrode 14 is supplied with voltage signals by a signal line 15, which may be part of a first electrical element arranged in the first support plate 5. A second signal line 16 is connected to an electrode which is in contact with the conductive second fluid 12. This electrode may be common to all elements, when they are fluidly interconnected by and share the second fluid, uninterrupted by walls. The picture element 2 can be controlled by a voltage V applied between the signal lines 15 and 16. The electrodes 14 of the support plate 5 each are coupled to a display driving system. In a display device having the elements arranged in a matrix form, the electrodes can be coupled to a matrix of printed control lines on the first support plate.

The first fluid 11 is confined to one picture element by walls 17 that follow the extent of the picture element. Although the walls are shown as structures protruding from the first support plate 5, they may instead be a surface layer on the first support plate that repels the first fluid, such as a hydrophilic layer. The walls may extend from the first to the second support plate but may also extend partly from the first support plate to the second support plate. The extent of the picture element, indicated by the dashed lines 3 and 4, is defined by the center of the walls 17. The area of the hydrophobic layer 16 between the walls of a picture element, indicated by the dashed lines 18 and 19, is a display area 20 over which a display effect occurs. The display area 20 lies in the plane of a surface 23 of the hydrophobic layer 13.

When no voltage is applied between the electrodes, the first fluid 11 forms a layer between the walls 17, as shown in the Figure. Application of a voltage to the electrode 14 will contract the first fluid, for example against a wall as shown by the dashed shape 21 in the Figure. The shape of the first fluid is controllable by controlling the applied voltage, and is used to operate the picture element as a light valve, providing a display effect over the display area 20. Further details of features of the display device are described in International patent publication no. WO2003/071346, the contents of which is incorporated herein by way of reference.

Figure 2:
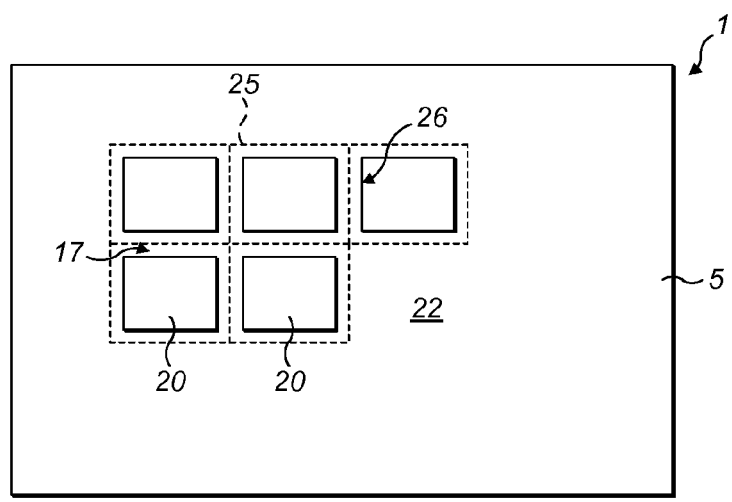
FIG. 2 shows a schematic plan view of the first support plate of the electrowetting display device.

FIG. 2 shows a schematic view along the line A-A in FIG. 1. FIG. 2 shows five adjacent picture elements of the display device 1, in a plan view of the first support plate. The picture elements are arranged in a matrix. For clarity, not all picture elements of the matrix are shown; instead, an arbitrary selection of five picture elements is illustrated. A plurality of display areas 20, each being the display area of a picture element, together form a display area 22 of the display on which an image is created. The walls 17 are arranged in the areas around the display areas 20 of the picture elements. The dashed line 25 indicates the extent of each picture element. Parts of the dashed line 25 therefore correspond to the dashed lines 3 and 4 defining the extent of the picture element in FIG. 1. Line 26 indicates the border of the display area 20. Parts of line 26 therefore correspond with the dashed lines 18, 19 in FIG. 1.

Figure 3:
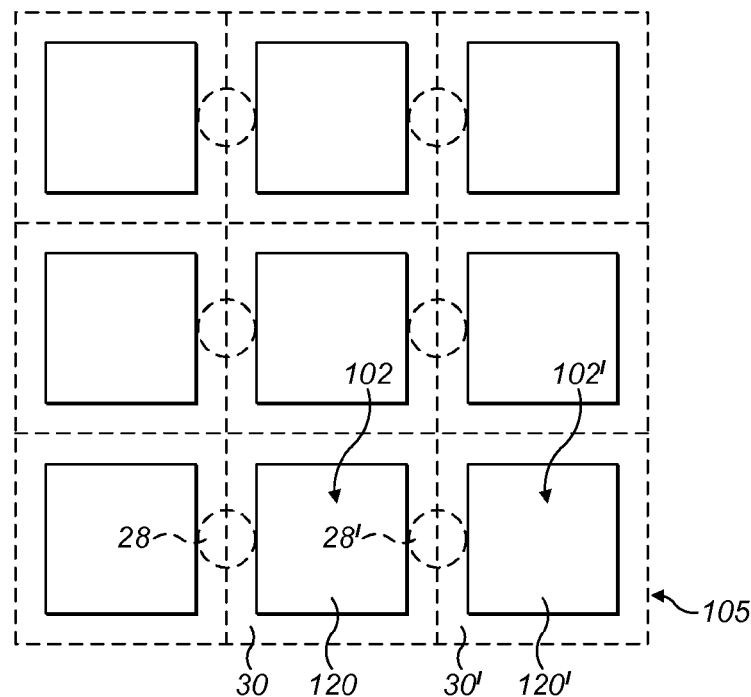
FIG. 3 shows schematically a plan view of an embodiment.

FIG. 3 shows schematically a plan view of part of the first support plate of an embodiment, taken in the same plane as FIG. 2. Features described previously are referred to using the same reference numerals, incremented by 100; corresponding descriptions should be taken to apply here also. For explanation purposes, a first picture element and a second picture element are referred to below. Features of these two picture elements are similar and are referred to using the same reference numerals, incremented by a prime character, i.e. ', for the second picture element.

The surface of a first support plate 105 comprises a plurality of display areas 120, each display area being part of a picture element which is similar to that described above, except that for at least one of the picture elements the first support plate comprises a through-connection 28, arranged outside a projection of the display area 120, which electrically connects a first electrical element with a second electrical element, as will be described in more detail below. At least one of the picture elements, and in this embodiment each picture element, comprises a border area 30 outside of the display area 120, and at least part of the through-connection 28 is arranged in a projection of the border area. The border area 30 of a first picture element 102 adjoins the border area 30' of at least a second picture element 102' which neighbors, i.e. is adjacent to, the first picture element. In this embodiment the border area of each picture element is square and surrounds the display area of that picture element. In other embodiments, the display area may be differently shaped, as may be the border area, for example to surround the display area. Referring to FIG. 1, the border area 30 may be considered to correspond to an area having an extent between dashed lines 18 and 3, and 19 and 4. The border area of at least one of the picture elements, and in this embodiment each of the picture elements, comprises at least part of a wall arranged to confine the first fluid to the display area of each picture element. In this embodiment, the wall fills the border area of each picture element, such that one wall covers the border area at one side of the first picture element and the border area at one side of the second picture element. In other embodiments, only part of the border area of each picture element may comprise at least part of a wall. Such walls are similar to the walls described previously in relation to FIG. 1; further details will be explained later.

Referring to FIG. 3, the through-connection 28 is arranged between a projected display area of the first picture element 102 and a projected display area of the second picture element 102'. Further, at least part of the wall is arranged to partially or to fully cover the through-connection 28. In this embodiment the wall fully covers the through-connection 28. A dashed circular line represents the position of the through-connection 28 beneath the walls located in the border area 30. In this embodiment, the through-connection 28 for the first picture element 102 is arranged on the opposite side of its display area 120 from the through-connection 28' for the second picture element 102'. Similarly, the through-connection for a third picture element (not indicated) would be arranged on an opposite side of the display area 120' for the second picture element 102'. Each through-connection is positioned at the midpoint of a side of the associated display area, as illustrated, but in other embodiments may be offset from the midpoint. The through-connections of picture elements in other rows of the picture element matrix may be arranged similarly.

Figure 4:
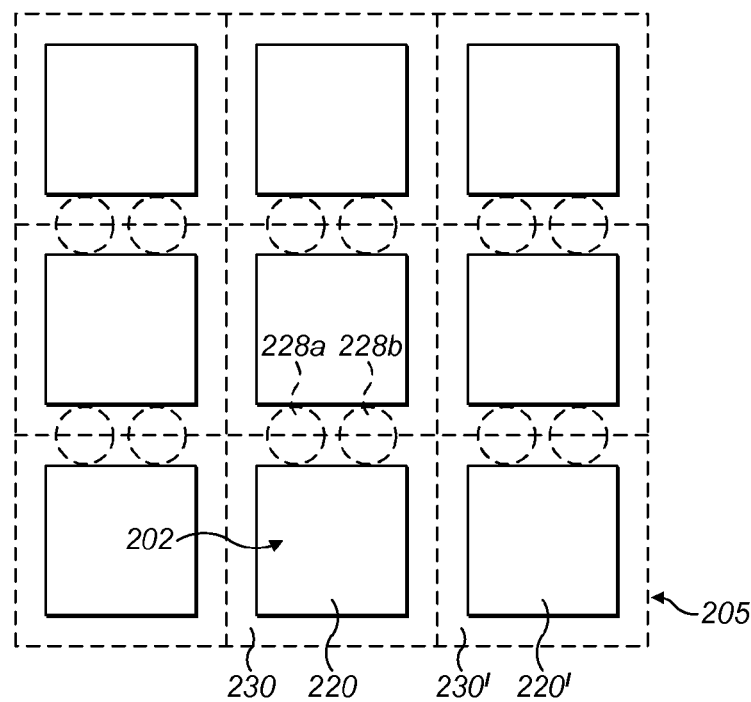
FIG. 4 shows schematically a plan view of a further embodiment.

FIG. 4 shows a further embodiment. Features described previously are referred to using the same reference numerals, incremented by 200; corresponding descriptions should be taken to apply here also. In this embodiment, part of the first support plate 205 is illustrated and the through-connections 228 are positioned in an alternative arrangement in the border area 230. This arrangement is similar to that of FIG. 2, however, each picture element 202 comprises two second electrical elements, for example electrodes (not indicated) for applying a voltage over the display area, and one or two first electrical elements, for example control lines. Each picture element therefore is associated with two through-connections: a first through-connection 228a connecting one of the electrodes and one of the control lines, and a second through-connection 228b connecting the other of the electrodes to the same or a second control line. Both through-connections 228a, 228b are arranged in the projected border area 230, outside of the projected display area 220. In this example, both through-connections for one picture element are arranged at one side of the display area 220, between the display areas of two adjacent picture elements. In other embodiments the two through-connections may be arranged at different sides of the display area. An example of a two electrode picture element is described in International patent publication no. WO2008/026179 or WO2004/104671, the contents of each of which is incorporated herein. In one example, one electrode drives the picture element and the other electrode may be used for collecting the first fluid, when contracted, or a voltage may be applied to the other electrode to achieve fast switching from the contracted state of the first fluid to a state when the first fluid is not contracted and adjoins the hydrophobic layer.

FIG. 5 shows an alternative embodiment. Features described previously are referred to using the same reference numerals, incremented by 300; corresponding descriptions should be taken to apply here also. For explanation purposes, a first, second, third and fourth picture element are referred to below. Features of these four picture elements are similar and are referred to using the same reference numerals, incremented by a prime character, i.e. ', '' and ''' for the second, third and fourth picture elements, respectively.

In this embodiment, there are at least four picture elements, namely a first, second, third and fourth picture element 302, 302', 302'' and 302''' which are arranged adjacent each other, as illustrated in the Figure. There is a junction 32 where the border areas 330, 330', 330'', 330''' of the first, second, third and fourth picture elements meet. The through-connection 328 for one picture element, for example the first picture element, is arranged outside the projected display areas of the four picture elements, as viewed in FIG. 5, and at the junction 32, i.e. between the projected display areas first, second, third and fourth picture elements. Therefore, at least part of the through-connection 328 is arranged in the projected border area of each of the first, second, third and fourth picture elements. Similarly, the through-connections for further picture elements in the matrix of picture elements are each arranged at a junction between four of the picture elements.

Figure 6:
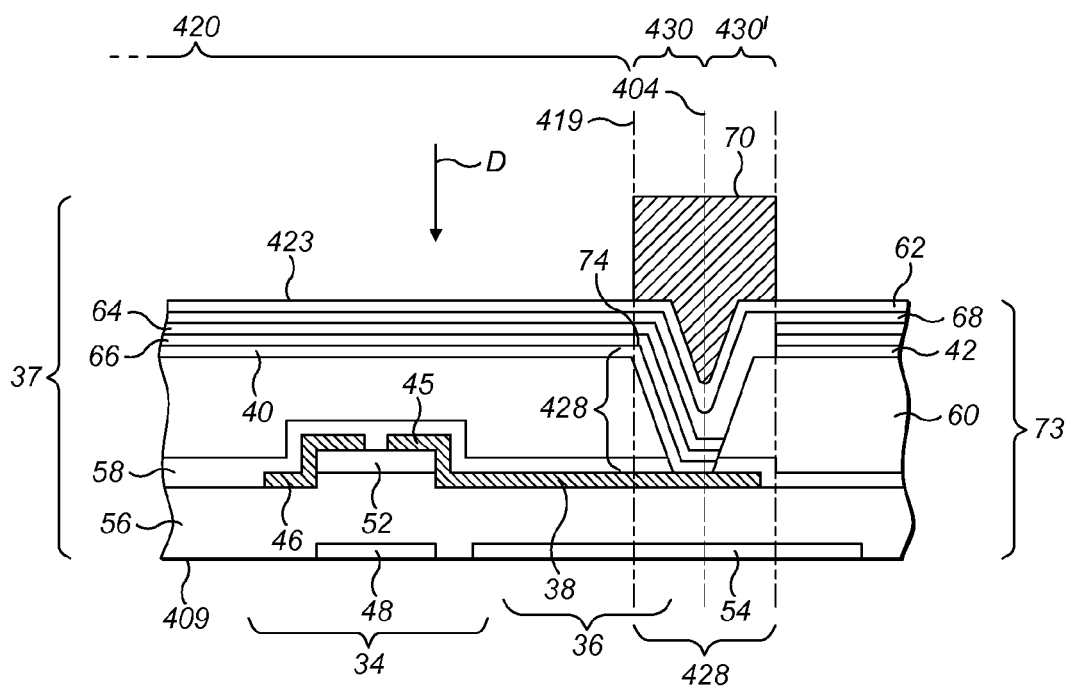
FIG. 6 shows a cross-section of a picture element of an embodiment.

FIG. 6 shows a cross-section of part of a reflective electrowetting display, according to an embodiment. This cross-section may be of the embodiment illustrated in FIG. 3, taken in a plane perpendicular that of the FIG. 3 and which bisects one of the through-connections. Features described previously are referred to using the same reference numerals, incremented by 400; corresponding descriptions should be taken to apply here also.

A stack of layers of insulating and conducting layers forming electronic components of a circuit of the display device is arranged on a substrate (not indicated) of the first support plate 37, the substrate being made of, for example, glass or plastic. An example of such a circuit is described in International patent publication no. WO2009/071694, the contents of which is incorporated herein by way of reference. Although the example therein describes two transistors in a picture element, an alternative single transistor design, as illustrated in FIG. 6, would be readily understood by the skilled person.

A first electrical element may be an electronic component, a part of an electronic component, or connected to an electrical component, such as a thin film transistor (TFT) 34, a capacitor 36 or metal or insulating layers thereof, or a control line, formed in the first support plate 37. A through-connection 428 electrically connects the first electrical element 38 explained in more detail below with a second electrical element which is for example an electrode 40, similar to the electrode 14 of FIG. 1, for applying an electric field in the picture element. The first electrical element is arranged to provide a voltage signal to the electrode 40, via the through-connection, i.e. by passing current through the through-connection. The electrode 40 is electrically insulated from the corresponding electrode 42 of an adjacent picture element by insulating material of the insulating layer 60 and the barrier layer 68 described below, so the voltage signal applied to the second electrical element does not interfere with the adjacent picture element display effect.

The first electrical element is for example connected to the drain 45 of the transistor 34 in order to control the voltage on electrode 40, thereby influencing the display effect created in the display area of the electrowetting picture element. The electrode 40 is made of an electrically conductive material. The transistor 34 comprises a source 46, gate 48 and drain 45, which are arranged in the first support plate 37. It will be readily appreciated by the skilled person that the source 46 of the transistor is connected to a source line (not shown) which may lie in a plane perpendicular to the cross-section of FIG. 3. The gate 48 is covered by an insulating layer 56, e.g., made of silicon nitrite, SiNx, typically having a thickness between 150 nm and 300 nm. The drain 45 of the TFT 34 is connected to the first electrical element layer 38 which also forms the top plate of storage capacitor 36. The transistor 34 has an active area 52 overlaying the gate 48. The storage capacitor 36 has a lower electrode 54. The active area 52 is arranged between an insulating layer 56 and the source 46 and drain 45 of the transistor 34. The active layer of the thin film transistor, commonly used in display devices, may be made of, for example, an amorphous silicon layer or Low Temperature Poly-silicon (LTPS).

The transistor 34 and the storage capacitor 36 are covered by an insulating layer 58, made of e.g. SiNx or SiOx, which may have a thickness between 200 and 800 nm. The insulating layer 58 is covered by a further layer 60 which may be made of an organic material, such as epoxy or acrylate polymer having a thickness of about 2 to 4 micrometer. The electrode 40 is arranged on the further layer 60.

In the reflective electrowetting display of FIG. 6, a hydrophobic layer 62, made of e.g. AF1600, having a thickness between 200 nm and 1000 nm, may be arranged on a barrier layer 68 having a thickness between 100 nm and 150 nm and arranged between a reflective layer 64 described below and the hydrophobic layer 62. The barrier layer may be made of an inorganic material like silicon oxide or silicon nitride or a stack of these (silicon oxide-silicon nitride-silicon oxide) or an organic material like polyimide or parylene. Moreover, the barrier layer 68 may comprise multiple layers having different dielectric constants. The reflective layer 64 for example made of Aluminum (Al), and a layer 66 such as Molybdenum (Mo) are each applied over the electrode 40 made of for example indium-tin-oxide (ITO), and therefore Mo does not significantly contribute to reflection in the display. The reflective and Mo layers 64 and 66 do not continue uninterrupted into adjacent picture elements, and their extent ends under the wall 70, in the depression of the through-connection 428. This arrangement avoids electrical connection between adjacent picture elements. Direct contact of Al with the electrode 40 should be avoided as this can lead to unwanted electrochemical reactions; therefore, the layer of Mo is deposited between the Al layer 64 and electrode 40. When the display device is of a reflective type, the electrode may alternatively be made of separate layers of Al or Neodymium (Nd) or an alloy of Al and Nd or separate layers of Al or Mo or an alloy of Al and Mo, with a thickness between 100 nm and 150 nm.

The display area 420 has a lateral extent as illustrated using FIG. 1. FIG. 6 illustrates the right hand side of a picture element of an embodiment, and therefore shows only the right hand extent 404 of the picture element, and the right hand extent 419 of the display area 420. It is to be understood that the left hand extent of the picture element and display area in this embodiment are similar to those described using FIG. 1. A surface 423 of the hydrophobic layer 62 defines the plane of the display area 420. As explained previously, for clarity of description, a projected display area and a projected border area is defined. The projected display area corresponds with a part of the first support plate having the extent of the display area, projected through the first support plate in a direction D perpendicular the plane of the display area, by a distance 73 taken between the surface 423 and in this example the rear side 409. The projected border area corresponds with a part of the first support plate having the extent of the border area 430, which lies in the same plane as the display area 420 for example, and is projected through the first support plate in the direction D by distance 73. The border area 430' of the adjacent picture element may similarly be projected by distance 73.

The electrode 40 is connected to the first electrical element layer 38 by the through-connection 428 through the insulating layers 58 and 60 of the first support plate, which layers separate the first and second electrical elements. Therefore, there is a height difference between the first and second electrical elements. The through-connection is a local depression of the electrode 40, such that it contacts the layer 38 of the first electrical element. The layers applied on the electrode 40, namely the Mo layer 66, the Al layer 64, the barrier layer 68 and the hydrophobic layer 62, are similarly depressed at the position of the through-connection 428. Walls 70, similar to those described in FIG. 1, are formed on the hydrophobic layer 62 to at least partly, in this embodiment completely, cover the through-connection 428 with wall material, filling the depression caused by the through-connection.

When a voltage is applied to the second electrode 40, via the through-connection 428, there may be an electric fringe field. The fringe field may be caused for example by a point 74 where the second electrode 40 starts to depress to form the through-connection. The change in shape of the electrode at the point facing the fluids may cause the fringe field. By arranging the through-connection outside the projected display area, the effects of the fringe field at the display area, and therefore the effect on the configuration of first and second fluids, is reduced or eliminated. For the fringe field to be outside of the display area, in further embodiments, the through-connection may be arranged further away from the display area than illustrated. For example, the extent of the display area may be less, having thicker walls, and/or the depth of the through-connection in the first support plate may be greater.

In a further embodiment the display device may be a transmissive display device, similar to that described using FIG. 6, but without the reflective layer.

The manufacture of an electrowetting display device is now described with reference to the structure described in FIG. 6.

During manufacture of such an electrowetting display device, layers of different materials may be arranged on a substrate 36 of e.g. plastic or glass. The first support plate 37 is provided at least partly pre-assembled with the first electrical element, in this embodiment the layer 38 connected to the drain 45. The through-connection 428 is formed in the first support plate and connects the first electrical element with the second electrical element, such as electrode 40, for each picture element. The at least partly pre-assembled first support plate provided is for a display device comprising at least one picture element each having a display area, the through-connection for each picture element being arranged outside the projected display area of the corresponding picture element. The Mo and the reflective Al layers 66, 64 may be applied over the electrode 40 using Physical Vapor Deposition (PVD), such as sputter deposition or electron beam evaporation in which temperature, pressure and power are the main deposition parameters to control the deposition of the layer. Such deposition processes are well known to the skilled person.

Subsequently, an insulating layer 68 is arranged over the reflective layer; the insulating layer 68 is a barrier layer such as Si—O which may be applied using Chemical Vapor Deposition (CVD) or PVD. The main process parameters for PVD are as described above, while CVD requires consideration of at least the combination of deposition gases and flow rates thereof, temperature and pressure in the deposition chamber, which parameters are well known to the skilled person In a next step the hydrophobic layer 62, which may be an amorphous fluoropolymer layer such as AF1600, is applied on the barrier layer 68, for example by a wet coating process, such as flexoprinting, spin coating, slit coating or dip coating which are well known to the skilled person.

Part of the surface of the hydrophobic layer 62 may be prepared for application of the wall 70 by a process step reducing the hydrophobicity of the surface. This step may include reactive ion etching and/or a plasma treatment. The part of the surface 423 inside the display area of the picture element may be screened off from this step. The walls may be arranged on the hydrophobic layer 62 to cover the through-connection 428, and filling the depression, using a known method, which may involve spinning the wall material, e.g. SU-8, onto the surface 72, prebaking the layer of wall material, patterning the layer using photo-lithography and removing the wall material from the display area. In this embodiment, when forming walls outside the display area, the through-connections are completely filled with wall material.

The resulting first support plate is filled with the first and second fluids and subsequently the first and second plates are appropriately coupled and sealed. For example, the first fluid is applied to the first support plate using a known method, as disclosed for example in International patent publication no. WO2005/098797. The first support plate and second support plate are mounted together using e.g. pressure-sensitive adhesive, after the space has been filled with the second fluid in a known manner, as disclosed e.g. in International patent publication no. WO2009/065909.

The above embodiments are to be understood as illustrative examples. Further embodiments are envisaged. For example, a through-connection for a picture element may be arranged outside the projected display area but with an alternative positioning from those described above.

Further, the shape of the through-connection may be different from that described above, for example the circular shape illustrated in FIG. 3. Such different shapes can include, for instance, an elongated shape as viewed in the plane of FIG. 3, lying within and along a side of the border area. Such an elongated shape may facilitate positioning of the wall of the picture element, such that it fully covers the through-connection.

In another envisaged embodiment, the wall shape may be chosen to deviate from a straight sided shape. For instance, when viewed in the plane of FIG. 3, the wall may be thicker at the position covering the underlying through-connection, to ensure that the entire through-connection is covered by the wall. In this way, an effect of a fringe field in the display area may be eliminated, for example, whilst increasing the size of the display area at thinner parts of the wall which do not cover the through-connection.

In embodiments described above, the walls may be transparent. In such embodiments, where the reflective layer is underneath the wall, the contrast-ratio of the display may be reduced. To reduce or avoid this effect, a part of the reflective layer that is situated underneath the wall could instead be transparent. In another embodiment, the part of the reflective layer underneath the wall can be designed in such a way that the area of that part underneath the wall is minimized, for instance by only using a thin strip of reflective layer.

Further, as in embodiments described above, the second electrical element is within the extent of a picture element. In other embodiments, a picture element may comprise a part of the second electrical element, which part may be an electrode corresponding with a display area of the picture element; another part of the second electrical element may be outside that picture element, which other part may for example be a connector connecting the electrode part to the through-connection. Further, the first electrical element may be at least partly within a picture element, or outside that picture element. The through-connection may be at least partly within a picture element as in embodiments above, or may be entirely within or outside a picture element it is associated with. The skilled person would readily understand possible configurations of the first electrical element, the second electrical element and the through-connection, within the scope of the claims.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the accompanying claims.

What is claimed is:

1. An electrowetting display device comprising:
at least one picture element comprising:
a first support plate;
a second support plate; and,
located between the first support plate and the second support plate, a first fluid and a second fluid, the first fluid immiscible with the second fluid,
the first support plate comprising:
a first electrical element;
a second electrical element; and
a through-connection connecting the first electrical element to the second electrical element,
the at least one picture element comprising at least part of the second electrical element and a display area,
the through-connection located outside the display area as projected through the first support plate and such that, with a voltage applied to the second electrical element, a fringe field is outside the display area, the fringe field being substantially absent in the display area.

2. The electrowetting display device according to claim 1, the at least one picture element comprising a first picture element and a second picture element, the display area being a first picture element display area of the first picture element, the through-connection being arranged between the first picture element display area as projected through the first support plate and a second picture element display area of the second picture element as projected through the first support plate.

3. The electrowetting display device according to claim 2, wherein the first picture element and the second picture element are neighboring picture elements.

4. The electrowetting display device according to claim 3, the at least one picture element comprising a third picture element and a fourth picture element, the through-connection being arranged between the first picture element display area as projected through the first support plate, the second picture element display area as projected through the first support plate, a third picture element display area of the third picture element as projected through the first support plate and a fourth picture element display area of the fourth picture element as projected through the first support plate.

5. The electrowetting display device according to claim 1, the at least one picture element comprising a border area outside of the display area, at least part of the through-connection being arranged in the border area as projected through the first support plate.

6. The electrowetting display device according to claim 2, the first picture element comprising a first picture element border area outside of the display area and the second picture element comprising a second picture element border area outside of the display area, at least part of the through-connection being arranged in the first picture element border area as projected through the first support plate and the second picture element border area as projected through the first support plate.

7. The electrowetting display device according to claim 4, the third picture element comprising a third picture element border area outside of the display area and the fourth picture element comprising a fourth picture element border area outside of the display area, the through-connection being arranged in the third picture element border area as projected through the first support plate and the fourth picture element border area as projected through the first support plate.

8. The electrowetting display device according to claim 5, wherein the border area of the at least one picture element comprises at least part of a wall arranged to confine the first fluid to the display area.

9. The electrowetting display device according to claim 8, wherein one or more of: the at least part of the wall is arranged to partially cover the through-connection or the at least part of the wall is arranged to fully cover the through-connection.

10. The electrowetting display device according to claim 1, wherein the second electrical element is an electrode for applying an electric field in the at least one picture element and the first electrical element is arranged to provide a voltage signal to the electrode, via the through-connection.

11. The electrowetting display device according to claim 10, wherein the first electrical element is one or more of: connected to or part of one or more of: a control line, a transistor or a capacitor.

12. The electrowetting display device according to claim 1, wherein the through-connection is arranged through at least one layer of the first support plate, the at least one layer separating the first electrical element and the second electrical element.

13. The electrowetting display device according to claim 1, wherein the first support plate comprises a further second electrical element and a further through-connection electrically connecting the first electrical element to the further second electrical element, the at least one picture element comprising at least part of the further second electrical element, the further through-connection being outside the display area as projected through the first support plate.

14. The electrowetting display device according to claim 1, wherein the first support plate comprises a further first electrical element, a further second electrical element and a further through-connection electrically connecting the further first electrical element to the further second electrical element, the at least one picture element comprising at least part of the further second electrical element, the further through-connection being outside the display area as projected through the first support plate.

15. A support plate for an electrowetting display device, the electrowetting display device comprising at least one picture element having a display area, the support plate comprising:
 a first electrical element;
 a second electrical element; and
 a through-connection connecting the first electrical element to the second electrical element,
 wherein the through-connection is located outside the display area as projected through the support plate and such that, with a voltage applied to the second electrical element, a fringe field is outside the display area, the fringe field being substantially absent in the display area.

16. The support plate according to claim 15, comprising wall material which at least partly covers the through-connection.

17. A method of manufacturing a first support plate for an electrowetting display device comprising at least one picture element, the first support plate, a second support plate and, located between the first support plate and the second support plate, a first fluid and a second fluid, the first fluid immiscible with the second fluid,
 the method comprising:
 forming a first electrical element of the first support plate from electrically conductive material;
 forming at least one layer on the first electrical element; and
 forming a second electrical element of the first support plate from electrically conductive material on the at least one layer, comprising forming a through-connection through the at least one layer and outside a display area of at least one picture element of the electrowetting display device as projected through the first support plate and such that, with a voltage applied to the second electrical element, a fringe field is outside the display area, the fringe field being substantially absent in the display area.

18. The method according to claim 17, the at least one picture element comprising a first picture element and a second picture element, the display area being a first picture element display area of the first picture element, wherein the forming the through-connection comprises forming the through-connection between the first picture element display area as projected through the first support plate and a second picture element display area of the second picture element as projected through the first support plate.

19. The method according to claim 17, comprising forming at least part of a wall for confining the first fluid to the display area, wherein one or more of: the at least part of the wall is formed to partially cover the through-connection or the at least part of the wall is formed to fully cover the through-connection.

20. The electrowetting display device according to claim 1, wherein, with the voltage applied to the second electrical element, the fringe field is absent in the display area.

21. The electrowetting display device according to claim 1, wherein, with the voltage applied to the second electrical element, the fringe field is caused by a change in distance between the second electrical element and the second support plate.

22. The electrowetting display device according to claim 1, wherein the second electrical element is substantially planar in the display area as projected through the first support plate.

* * * * *

UNITED STATES PATENT AND TRADEMARK OFFICE
CERTIFICATE OF CORRECTION

PATENT NO. : 9,585,277 B2  
APPLICATION NO. : 14/205709  
DATED : February 28, 2017  
INVENTOR(S) : Giraldo et al.

Page 1 of 1

It is certified that error appears in the above-identified patent and that said Letters Patent is hereby corrected as shown below:

On the Title Page

Item (71), "Applicant", in Column 1, Line 1, delete "Liquavista B.V., Eindhoven (NL)" and insert -- Amazon Technologies, Inc., Seattle, WA (US) --, therefor.

Signed and Sealed this  
Twenty-fifth Day of April, 2017

Michelle K. Lee  
*Director of the United States Patent and Trademark Office*